(12) United States Patent
Hwang et al.

(10) Patent No.: US 11,107,743 B2
(45) Date of Patent: Aug. 31, 2021

(54) CHIP ON FILM PACKAGE AND DISPLAY DEVICE INCLUDING THE SAME

(71) Applicant: SAMSUNG ELECTRONICS CO., LTD., Suwon-si (KR)

(72) Inventors: Seung-Tae Hwang, Seoul (KR); Jae-Choon Kim, Incheon (KR); Kyung-Suk Oh, Seongnam-si (KR); Woon-Bae Kim, Seoul (KR); Jae-Min Jung, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 15 days.

(21) Appl. No.: 16/673,127

(22) Filed: Nov. 4, 2019

(65) Prior Publication Data
US 2020/0303276 A1    Sep. 24, 2020

(30) Foreign Application Priority Data
Mar. 20, 2019   (KR) .......................... 10-2019-0031968

(51) Int. Cl.
*H01L 23/31*    (2006.01)
*H01L 23/498*    (2006.01)
*H05K 1/14*    (2006.01)

(52) U.S. Cl.
CPC ...... *H01L 23/3135* (2013.01); *H01L 23/4985* (2013.01); *H01L 23/49838* (2013.01); *H05K 1/147* (2013.01); *H05K 2201/049* (2013.01); *H05K 2201/10128* (2013.01)

(58) Field of Classification Search
CPC ............. H01L 23/3135; H01L 23/4985; H01L 23/49838; H01L 23/3736; H01L 23/36; H01L 23/3737; H05K 1/147; H05K 2201/10128; H05K 2201/049
USPC ...... 361/679.46, 679.54, 702, 704, 706–708, 361/719, 720
See application file for complete search history.

(56) References Cited

U.S. PATENT DOCUMENTS 6,265,984 B1    7/2001   Molinaroli
6,677,664 B2 *  1/2004   Inoue ................. H05K 7/20963
                                                                  257/668
6,703,702 B2 *  3/2004   Inoue .................... H01L 23/057
                                                                  257/584

(Continued)

FOREIGN PATENT DOCUMENTS

JP    2012-061255    3/2012
KR    10-2015-0104243    9/2015
KR    10-2017-0071824    6/2017

*Primary Examiner* — Stephen S Sul
(74) *Attorney, Agent, or Firm* — F. Chau & Associates, LLC

(57) ABSTRACT

A chip on film package includes; a flexible base film having a first surface and a second surface opposite to each other, and having a chip mounting region on the first surface; a plurality of wirings extending in a first direction toward the chip mounting region; a semiconductor chip mounted in the chip mounting region on the first surface of the base film and electrically connected to the wirings; a pair of first heat dissipation members on the first surface of the base film and spaced apart from the semiconductor chip, and extending in a second direction perpendicular to the first direction; and a second heat dissipation member on the first surface of the base film and covering the semiconductor chip and the pair of first heat dissipation members.

16 Claims, 10 Drawing Sheets

(56) References Cited

U.S. PATENT DOCUMENTS

| | | | | |
|---|---|---|---|---|
| 7,254,031 B2* | 8/2007 | Kim | | H05K 7/20963 361/717 |
| 7,417,859 B2* | 8/2008 | Bae | | H05K 7/2099 361/710 |
| 7,719,841 B2* | 5/2010 | Yamashita | | H01L 23/4006 361/719 |
| 7,859,633 B2* | 12/2010 | Park | | H01L 23/60 349/150 |
| 8,872,337 B2* | 10/2014 | Kim | | H01L 23/4985 257/737 |
| 9,922,921 B2 | 3/2018 | Jung et al. | | |
| 2002/0047193 A1* | 4/2002 | Dorfler | | H05K 1/0207 257/687 |
| 2005/0070048 A1* | 3/2005 | Tolchinsky | | H01L 24/31 438/108 |
| 2005/0083646 A1* | 4/2005 | Bae | | H05K 7/20963 361/679.21 |
| 2005/0088092 A1* | 4/2005 | Kim | | H05K 7/20963 313/582 |
| 2005/0286228 A1* | 12/2005 | Kim | | H05K 7/20963 361/704 |
| 2006/0098398 A1* | 5/2006 | Kim | | G06F 1/1601 361/679.22 |
| 2006/0170349 A1* | 8/2006 | Kim | | H05K 7/2099 313/582 |
| 2006/0187641 A1* | 8/2006 | Shin | | H05K 7/20963 361/704 |
| 2008/0258290 A1* | 10/2008 | Nakajima | | H01L 24/27 257/690 |
| 2014/0055328 A1* | 2/2014 | Osako | | H05K 1/0203 345/87 |
| 2014/0254111 A1* | 9/2014 | Yamazaki | | H01L 51/0097 361/749 |
| 2015/0208550 A1* | 7/2015 | Rugg | | G11B 33/142 361/713 |
| 2015/0230331 A1* | 8/2015 | Lee | | H05K 1/0259 361/220 |
| 2015/0311148 A1* | 10/2015 | Jung | | H01L 23/49838 361/767 |
| 2017/0135209 A1* | 5/2017 | Kim | | H05K 1/09 |
| 2017/0170164 A1* | 6/2017 | Yip | | H01L 23/49855 |
| 2018/0158750 A1 | 6/2018 | Kim et al. | | |
| 2019/0011760 A1* | 1/2019 | Wang | | G02F 1/13452 |
| 2019/0204669 A1* | 7/2019 | Lee | | H01L 24/86 |

* cited by examiner

120

140a  120 150  140b

CHIP ON FILM PACKAGE AND DISPLAY DEVICE INCLUDING THE SAME

CROSS-REFERENCE TO RELATED APPLICATION

This application claims priority under 35 U.S.C. § 119 to Korean Patent Application No. 10-2019-0031968, filed on Mar. 20, 2019 in the Korean Intellectual Property Office (KIPO), the disclosure of which is incorporated by reference herein in its entirety.

TECHNICAL FIELD

Exemplary embodiments of the present inventive concept relate to a chip on film package and a display panel including the same. More particularly, exemplary embodiments of the present inventive concept relate to a chip on film package connected to a display panel and a touch panel, and a display device including the chip on film package.

DISCUSSION OF THE RELATED ART

A display panel may be connected to a driver which provides the display panel with a driving signal by a chip on film package. However, as a driving circuit chip mounted on the chip film package becomes more integrated, heat generated from the driving circuit chip may increase within the driving circuit chip.

SUMMARY

According to an exemplary embodiment of the present inventive concept, a chip on film package includes: a flexible base film having a first surface and a second surface opposite to each other, and having a chip mounting region on the first surface; a plurality of wirings extending in a first direction toward the chip mounting region; a semiconductor chip mounted in the chip mounting region on the first surface of the base film and electrically connected to the wirings; a pair of first heat dissipation members on the first surface of the base film and spaced apart from the semiconductor chip, and extending in a second direction perpendicular to the first direction; and a second heat dissipation member on the first surface of the base film and covering the semiconductor chip and the pair of first heat dissipation members.

According to an exemplary embodiment of the present inventive concept, a chip on film package includes: a flexible base film having a first surface and a chip mounting region on the first surface; a semiconductor chip mounted in the chip mounting region; a heat dissipating insulation layer on the semiconductor chip; a pair of first heat dissipation members on the first surface of the base film and spaced apart from the semiconductor chip; and a second heat dissipation member on the first surface of the base film and covering the semiconductor chip and the pair of first heat dissipation members.

According to an exemplary embodiment of the present inventive concept, a display device includes: a display panel; and a chip on film package extending from the display panel and flexed to cover a lower surface of the display panel, wherein the chip on film package includes: a flexible base film connected to the display panel, and having a first surface and a chip mounting region on the first surface; a semiconductor chip mounted in the chip mounting region; a heat dissipating insulation layer on the semiconductor chip; a pair of first heat dissipation members on the first surface of the base film and spaced apart from the semiconductor chip, wherein the semiconductor chip is disposed between the pair of first heat dissipation members; and a second heat dissipation member on the first surface of the base film to cover the semiconductor chip and the pair of first heat dissipation members.

BRIEF DESCRIPTION OF THE DRAWINGS

The above and other features of the present inventive concept will become more apparent by describing in detail exemplary embodiments thereof, with reference to the accompanying drawings, in which.

DETAILED DESCRIPTION OF THE EMBODIMENTS

Hereinafter, exemplary embodiments of the present inventive concept will be explained in detail with reference to the accompanying drawings. In all figures in this specification, a direction indicated by an arrow and a reverse direction thereto are considered as the same direction.

Figure 1:
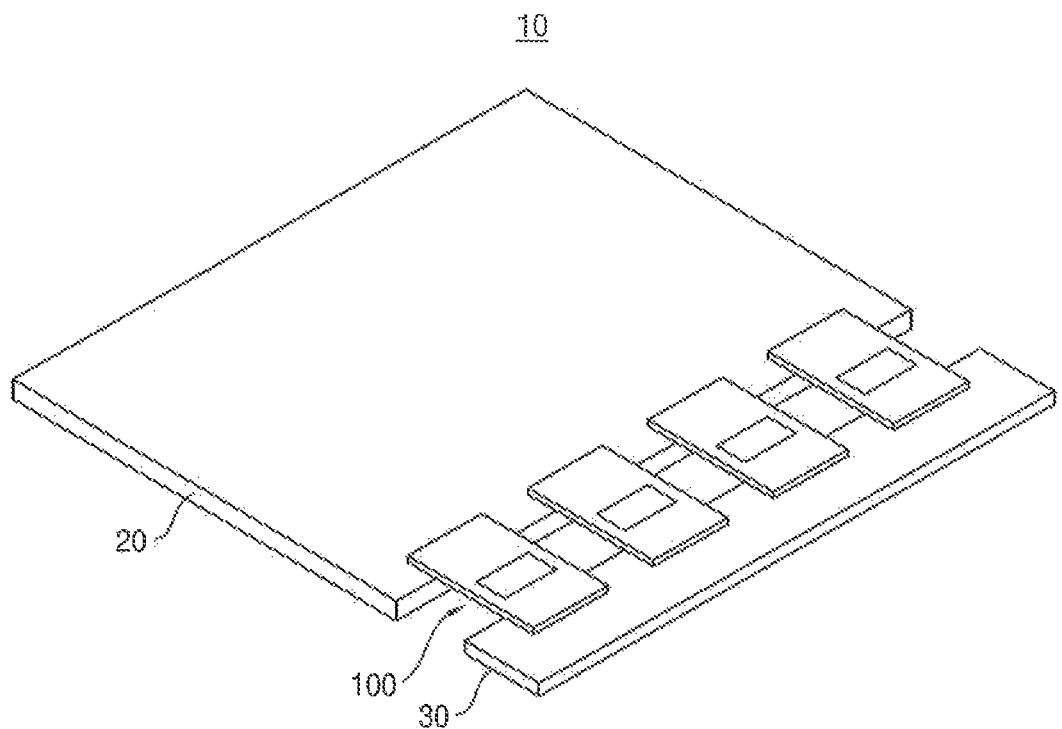
FIG. 1 is a perspective view illustrating a display device in accordance with an exemplary embodiment of the present inventive concept.
Figure 2:
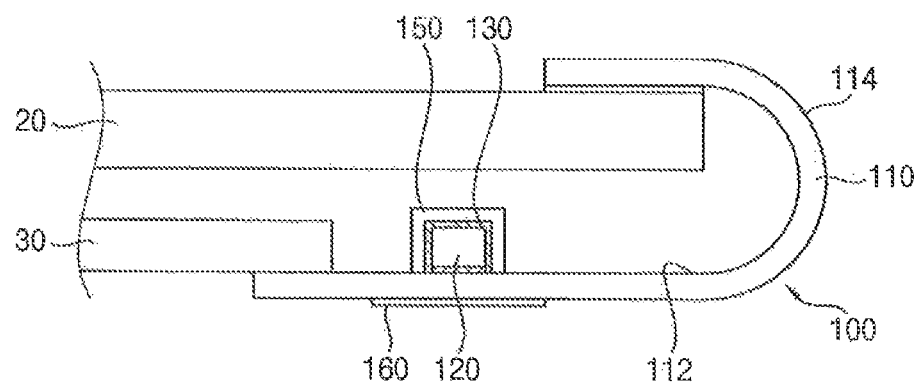
FIG. 2 is a cross-sectional view illustrating a curved chip on film package of the display device in FIG. 1 in accordance with an exemplary embodiment of the present inventive concept.

Referring to FIGS. 1 and 2, a display device 10 according to exemplary embodiment of the present inventive concept may include a display panel 20 to display an image, a driving circuit portion 30 configured to supply a driving signal to the display panel 20, and a chip on film package 100 configured to electrically connect the display panel 20 and the driving circuit portion 30 to each other.

In an exemplary embodiment of the present inventive concept, the display panel 20 may be a device which displays an image by the driving signal supplied from an external device. For example, the display panel 20 may be a liquid crystal display panel, an electrophoretic display panel, an organic light emitting diode panel, a plasma display panel, etc.; however, it may not be limited thereto.

The driving circuit portion 30 may be electrically connected to the chip on film package 100. For example, the driving circuit portion 30 may be a printed circuit board. The driving circuit portion 30 may include a driving circuit configured to generate or transfer the driving signal for driving the display panel 20.

The chip on film package 100 may transfer the driving signal supplied from the driving circuit portion 30 to the display panel 20. For example, the chip on film package 100 may electrically connect the driving circuit portion 30 and the display panel 20 to each other. A plurality of the chip on film packages 100 may be arranged along a side of the display panel 20.

As illustrated in FIG. 2, in an exemplary embodiment of the present inventive concept, the chip on film package 100 may include a flexible base film 110. The base film 110 may have a first surface 112 and a second surface 114 opposite to each other. The base film 110 may be an insulation film having flexibility. For example, the base film 110 may include polyimide, polyester, polycarbonate, poly-epoxy, etc.

Figure 4:
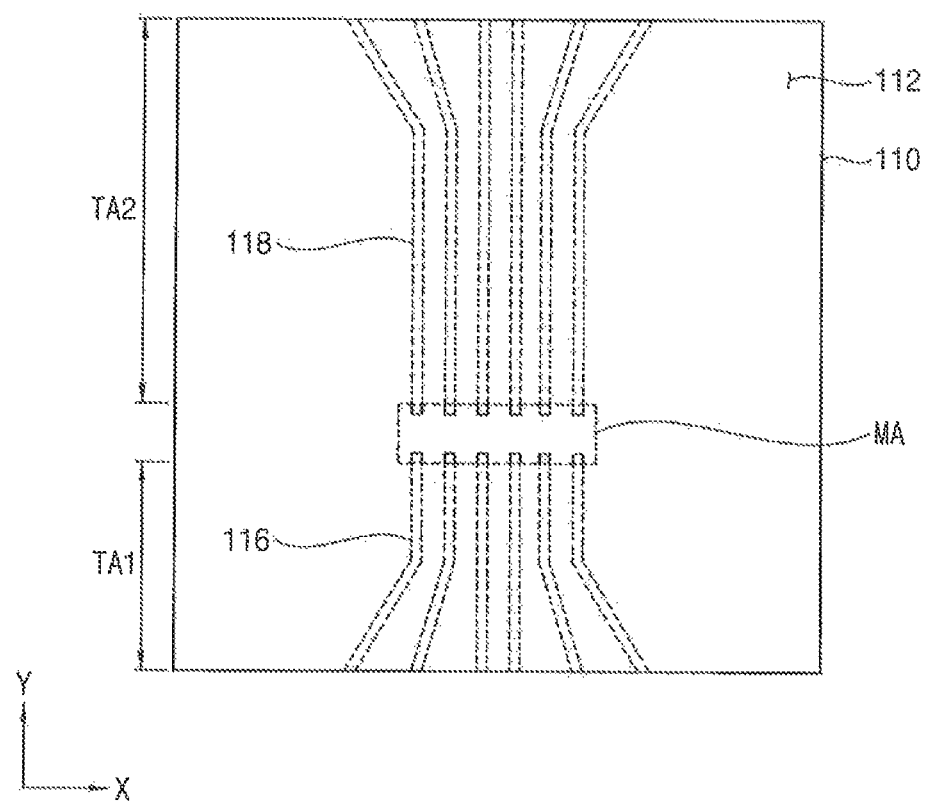
FIG. 4 is a plan view illustrating a base film of the chip on film package in FIG. 3 in accordance with an exemplary embodiment of the present inventive concept.

As illustrated in FIG. 4, the base film 110 may include a chip mounting region MA, a first terminal region TA1 in a first side of the chip mounting region MA and a second terminal region TA2 in a second side of the chip mounting region MA. The chip mounting region MA may be positioned in a middle region of the base film 110, and may be a region on which a semiconductor chip 120 is mounted. For example, the chip mounting region MA may be disposed between the first terminal region TA1 and the second terminal region TA2.

A wiring pattern may be formed on the first surface 112 of the base film 110. The wiring pattern may include a plurality of input wirings 116 and a plurality of output wirings 118. The input wirings 116 may extend in an extending direction Y of the base film 110, for example, a second direction in the first terminal region TA1. The output wirings 118 may extend in the second direction Y of the base film 110 in the second terminal region TA2. Each of the input wirings 116 and the output wirings 118 may be arranged along a first direction X substantially perpendicular to the extending direction (Y) of the base film 110 to be spaced apart from each other.

The input wiring 116 may include a first connection pad in an edge region of the first terminal region TA1, and the first connection pad of the input wiring 116 may be connected to the driving circuit portion 30 to function as an input terminal pad for receiving the driving signal. The input wiring 116 may include a second connection pad which is connected to a bump 122 (see FIG. 6) on an input terminal of the semiconductor chip 120 within the chip mounting region MA. Accordingly, the second connection pad may be electrically connected to the input terminal of the semiconductor chip 120.

The output wiring 118 may include a third connection pad which is connected to a bump 122 on an output terminal of the semiconductor chip 120 within the chip mounting region MA. Accordingly, the third connection pad may be electrically connected to the output terminal of the semiconductor chip 120. The output wiring 118 may include a fourth connection pad in an edge region of the second terminal region TA2, and the fourth connection pad of the output wiring 118 may be connected to the display panel 20 to function as an output terminal pad for outputting the driving signal.

An insulation layer may be coated on the base film 110 to cover the input wirings 116 and the output wirings 118. The first and second connection pads of the input wiring 116 and the third and fourth connection pads of the output wiring 118 may be exposed by the insulation layer. The insulation layer may include solder resist.

Figure 6:
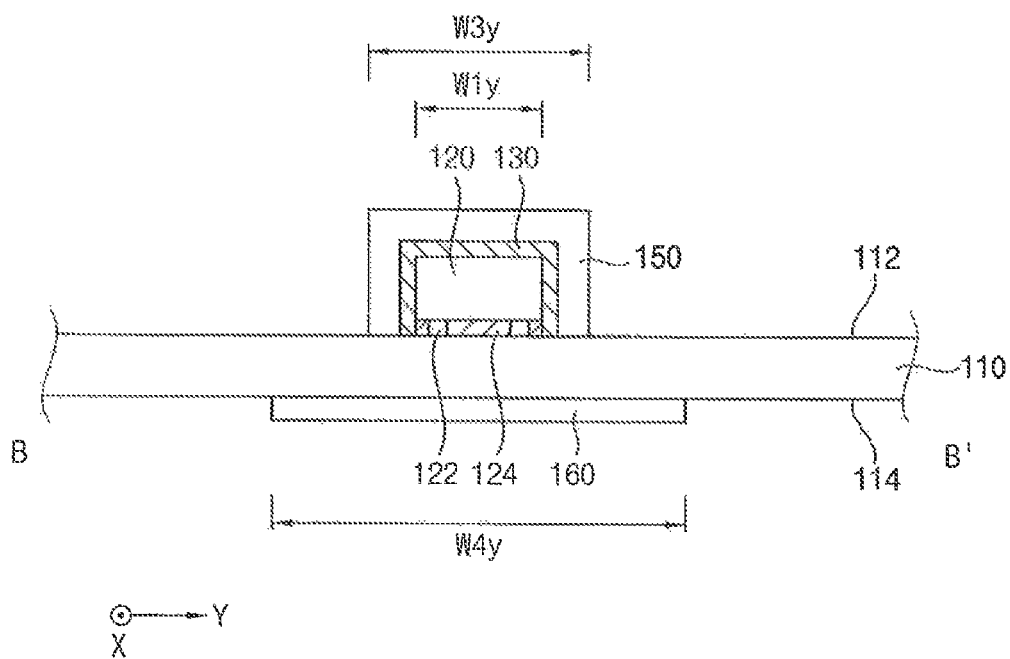
FIG. 6 is a cross-sectional view taken along the line B-B' in FIG. 3 in accordance with an exemplary embodiment of the present inventive concept.
Figure 7:
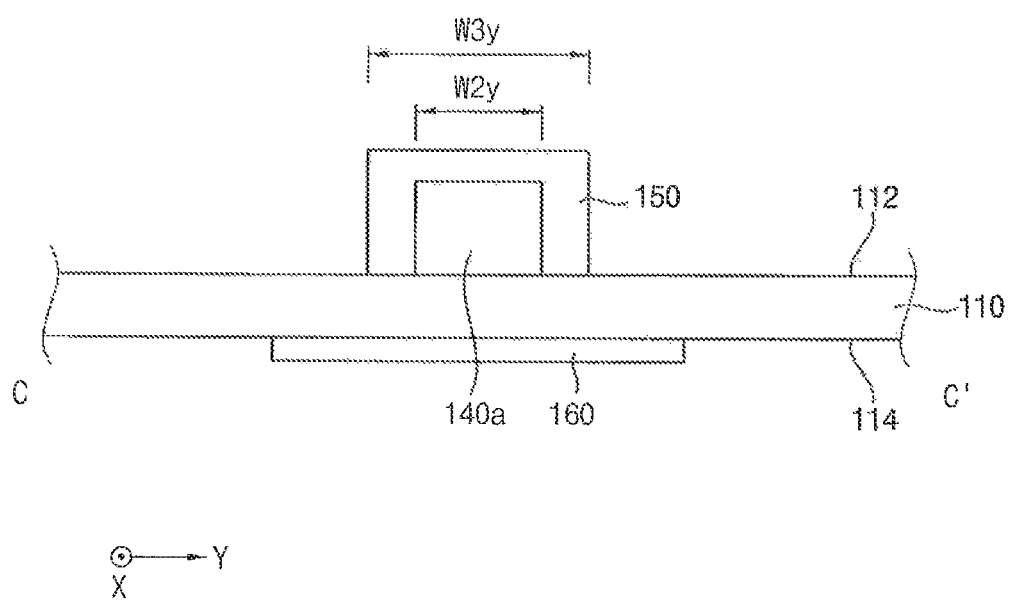
FIG. 7 is a cross-sectional view taken along the line C-C' in FIG. 3 in accordance with an exemplary embodiment of the present inventive concept.

The semiconductor chip 120 may be arranged on the chip mounting region MA of the base film 110. The semiconductor chip 120 may be a display panel driving chip. The semiconductor chip 120 may be electrically connected to the input wirings 116 and the output wirings 118 via the bumps 122. With reference to FIG. 6, an adhesive underfill layer 124 may be underfilled between the semiconductor chip 120 and the base film 110. For example, the underfill layer 124 may include an epoxy material to reinforce a gap between the semiconductor chip 120 and the base film 110.

Figure 3:
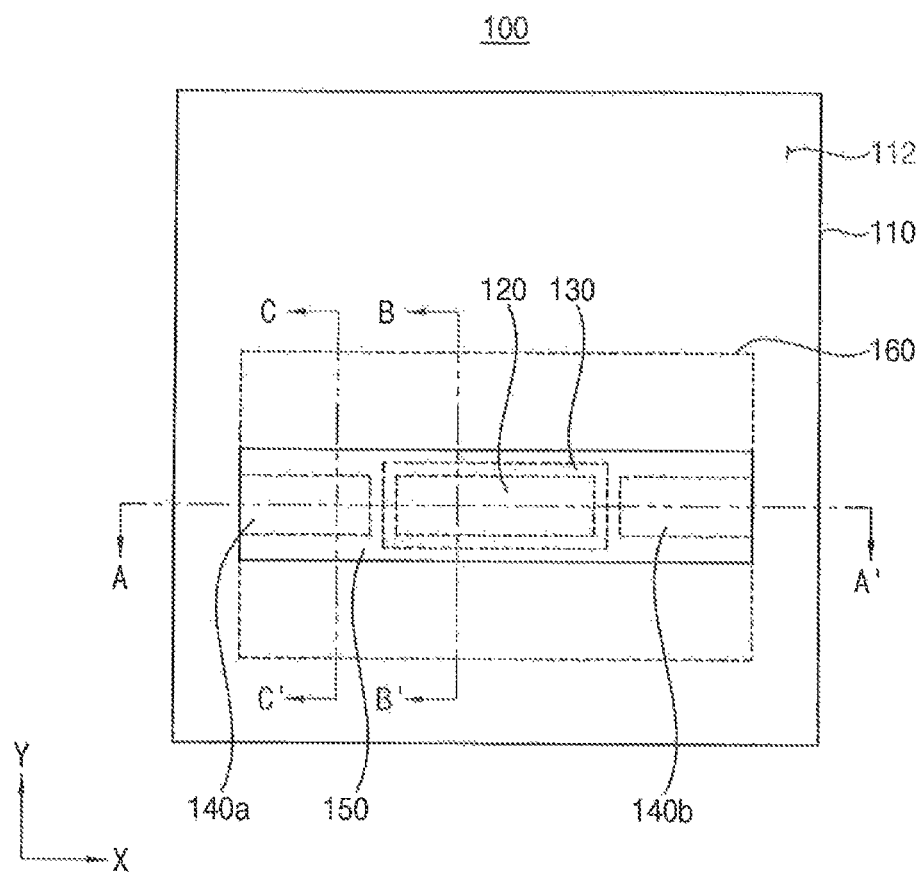
FIG. 3 is a plan view illustrating the chip on film package in FIG. 1 in accordance with an exemplary embodiment of the present inventive concept.
Figure 5:
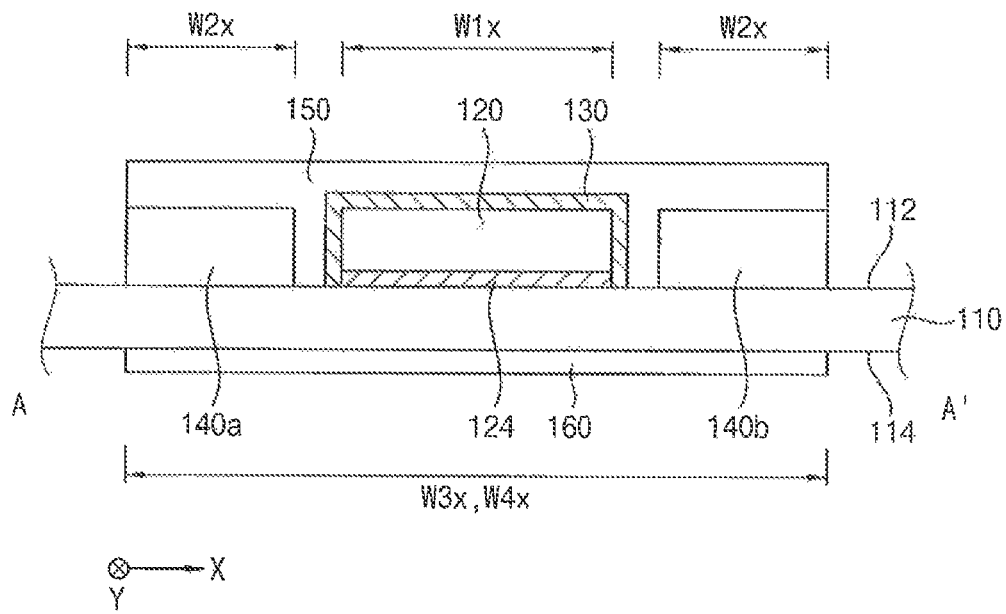
FIG. 5 is a cross-sectional view taken along the line A-A' in FIG. 3 in accordance with an exemplary embodiment of the present inventive concept.

As illustrated in FIGS. 3, 5 and 6, the semiconductor chip 120 may have a width $W1x$ in the first direction X and a width $W1y$ in the second direction Y. The width $W1x$ in the first direction X may be greater than the width $W1y$ in the second direction Y. For example, the width $W1x$ in the first direction of the semiconductor chip 120 may range from about 10 mm to about 30 mm. The width $W1y$ in the second direction of the semiconductor chip 120 may be range about 0.3 mm to about 1 mm. A height of the semiconductor chip 120 may be range about 400 μm to about 650 μm from the base film 110.

In an exemplary embodiment of the present inventive concept, a heat dissipating insulation layer 130 may be coated on the semiconductor chip 120. The heat dissipating insulating layer 130 may be coated conformally on the exposed surfaces of the semiconductor chip 120 including the underfill layer 124. For example, the heat dissipating insulation layer 130 may entirely cover exposed surfaces of the semiconductor chip 120, and the underfill layer 124 may be disposed between the semiconductor chip 120, the base film 110, and the heat dissipating insulation layer 130.

The heat dissipating insulation layer 130 may include an insulation material having thermal conductivity. For example, the heat dissipating insulation layer 130 may include silica ($SiO2$), aluminum oxide ($Al_2O_3$), boron nitride (BN), aluminum nitride (AlN), ceramics coated metal balls, etc. A thickness of the heat dissipating insulation layer 130 may range from about 0.01 mm to about 0.05 mm.

A pair of first heat dissipation members 140a and 140b may be disposed in both sides of the semiconductor chip 120 on the first surface 112 of the base film 110. The pair of first heat dissipation members 140a and 140b may extend in a direction substantially perpendicular to the extending direction (Y) of the base film 110, for example, the first direction X. The first heat dissipation members 140a and 140b may be spaced apart from respective sides of the semiconductor chip 120. For example, a space is between one of the first heat dissipation members 140a and a first side surface of the semiconductor chip 120, and a space is between the other first heat dissipation member 140b and a second side surface, opposite the first side surface, of the semiconductor chip 120. The first heat dissipation members 140a and 140b may be spaced apart from the heat dissipating insulation layer 130 on the semiconductor chip 120.

The first heat dissipation members 140a and 140b may include a silicon material. For example, the first heat dissipation members 140a and 140b may include a silicon dummy member, and may be adhered to the base film 110 by an adhesive film. The adhesive film may include a film such as DAF (a die attach film).

The first heat dissipation members 140a and 140b may each have a width W2x in the first direction and a width W2y in the second direction Y. The width W2x in the first direction X may be greater than the width W2y in the second direction Y. For example, the width W2x in the first direction X of each first heat dissipation member (140a or 140b) may range from about 4 mm to about 8 mm. The width W2y in the second direction Y of each first heat dissipation member 140a (and 140b) may range from about 0.5 mm to about 1 mm. A height of each first heat dissipation member 140a and 140b may range from about 500 μm to about 700 μm from the base film 110. A spacing between the semiconductor chip 120 and each first heat dissipation member 140a and 140b may range from about 0.5 mm to about 1.5 mm. A thickness of each first heat dissipation member 140a and 140b may be greater than a thickness of the base film 110.

In an exemplary embodiment of the present inventive concept, the first heat dissipation members 140a and 140b may have different widths and thickness from each other. However, the present inventive concept is not limited thereto.

The height of the first heat dissipation members 140a and 140b may be the same as or greater than the height of the semiconductor chip 120. The width W2y in the second direction Y of the first heat dissipation member 140a may be the same as or greater than the width W1y in the second direction Y of the semiconductor chip 120.

A second heat dissipation member 150 may be arranged on the first surface 112 of the base film 110 to cover the semiconductor chip 120 and the first heat dissipation members 140a and 140b. The second heat dissipation member 150 may be provided to fill the space between the semiconductor chip 120 and the first heat dissipation members 140a and 140b. The second heat dissipation member 150 may extend in a vertical direction to be in contact with the first surface 112 of the base film 110, and may extend between the semiconductor chip 120 and the first heat dissipation members 140a and 140b. Outer surfaces of the first heat dissipation members 140a and 140b (e.g., side surfaces furthest from the semiconductor chip 120) may be exposed by the second heat dissipation member 150. For example, sides surfaces of the first heat dissipation members 140a and 140b that are adjacent the semiconductor chip 120 are covered by the second heat dissipation member 150, and sides surfaces of the first heat dissipation members 140a and 140b that are farthest from the semiconductor chip 120 are not covered by the second heat dissipation member 150. However, the present inventive concept is not limited thereto. For example, the second heat dissipation member 150 may entirely cover the heat dissipation members 140a and 140b.

The second heat dissipating member 150 may include a metal paste. For example, the metal paste may include a metal material such as gold (Au), silver (Ag), copper (Cu), etc.

The second heat dissipation member 150 may have a width W3x in the first direction X and a width W3y in the second direction Y. The width W3x in the first direction may be greater than the width W3y in the second direction Y. For example, the width W3x in the first direction X of the second heat dissipation member 150 may range from about 20 mm to about 30 mm. The width W3y in the second direction Y of the second heat dissipation member 150 may range from about 2 mm to about 6 mm. A height of the second heat dissipation member 150 may range from about 600 μm to about 750 μm from the base film 110.

A length in the first direction X of the second heat dissipation member 150 may be the same as or greater than a sum of lengths in the first direction X of the semiconductor chip 120 and the first heat dissipation members 140a and 140b. The height of the first heat dissipation members 140a and 140b may be the same as or greater than the height of the semiconductor chip 120. The width W2y in the second direction Y of the first heat dissipation member 140a may be the same as or greater than the width W1y in the second direction Y of the semiconductor chip 120.

The first heat dissipation members 140a and 140b may have a first thermal conductivity, and the second heat dissipation member 150 have a second thermal conductive less than the first thermal conductivity. For example, the first thermal conductivity of the first heat dissipation members 140a and 140b may range from about 100 W/mK to about 140 W/mk, and the second thermal conductivity of the second heat dissipation member 150 may range from about 40 W/mK to about 80 W/mk.

As illustrated in FIGS. 3 and 5 to 7, a heat dissipation plate 160 may be disposed on the second surface 114 of the base film 110 to overlap with the chip mounting region MA. For example, the heat dissipation plate 160 may overlap the semiconductor chip 120. The heat dissipation plate 160 may extend in the first direction X. For example, the heat dissipation plate 160 may include a metal tape. The heat dissipation plate 160 may be a heat transfer member including a material with relatively high thermal conductivity. For example, the heat dissipation plate 160 may be a metal plate including aluminum, copper, silver, gold or an alloy thereof.

The heat dissipation plate 160 may have a width W4x in the first direction X and a width W4y in the second direction Y. The width in the first direction X may be greater than the width W4y in the second direction Y. For example, the width. W4x in the first direction X of the heat dissipation plate 160 may range from about 20 mm to about 30 mm. The width W4y in the second direction Y of the heat dissipation plate 160 may range from about 8 mm to about 16 mm. The width W4x in the first direction X of the heat dissipation plate 160 may be the same as the width W3x in the first direction X of the second heat dissipation member 150.

Referring again to FIG. 4, because the input wirings 116 and the output wirings 118 are arranged on the first surface 112 of the base film 110 to be spaced apart from each other along the first direction X and extend along the second direction Y, when a width of each wire of the wiring is substantially the same as a distance between adjacent wirings, an effective thermal conductivity (Keff_1) in the first direction X of the base film 110 and an effective thermal conductive (Keff_2) in the second direction Y of the base film 110 may be expressed by following Equations (1) and (2).

$$\text{Keff\_1} \approx \text{Kf} \qquad \text{Equation (1)}$$

$$\text{Keff\_2} \approx \text{Kw}/2 \qquad \text{Equation (2)}$$

Here, Kf is thermal conductivity of a flexible film material, and Kw is thermal conductivity of a wiring material.

Accordingly, because the thermal conductivity in the extending direction (Y), for example, the second direction Y of the base film 110 is much greater than the thermal conductivity in the first direction X of the base film 110, the base film 110 may have relatively low heat dissipation property in the first direction X.

Figure 8:
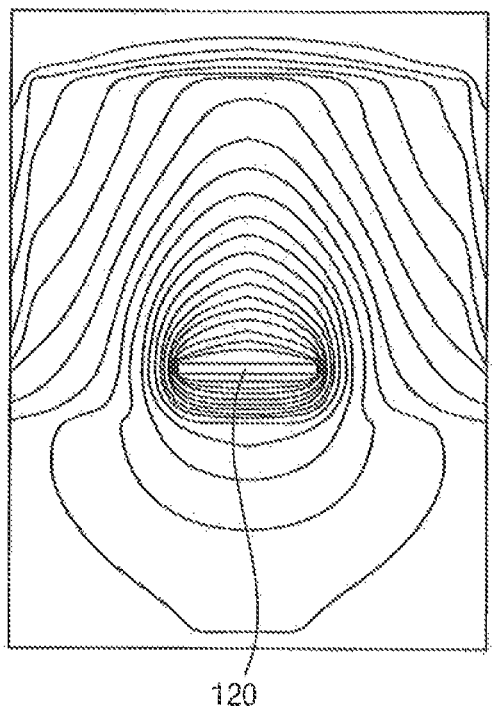
FIG. 8 is a graph illustrating a heat map of a conventional chip on film package including a semiconductor chip mounted on a base film, according to a comparative example.
Figure 9:
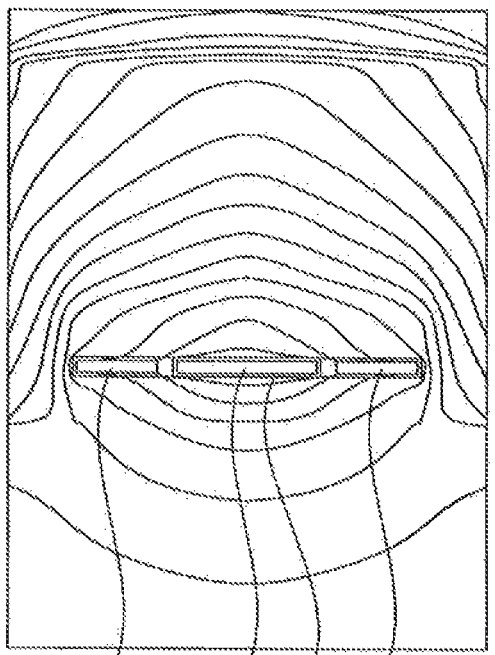
FIG. 9 is a graph illustrating a heat map of a chip on film package according to an exemplary embodiment of the present inventive concept including first and second heat dissipation members on a semiconductor chip.

FIG. 8 is a graph illustrating a heat map of a conventional chip on film package including a semiconductor chip mounted on a base film, according to a comparative example, FIG. 9 is a graph illustrating a heat map of a chip on film package according to an exemplary embodiment of the present inventive concept including first and second heat dissipation members on a semiconductor chip.

Referring to FIGS. 8 and 9, the maximum temperature in a chip mounting region of the chip on film package according to an exemplary embodiment of the present inventive concept in FIG. 9 is relatively lower than the conventional chip on film package in FIG. 8, and thus, it may be appreciated that the heat dissipation property in the lateral direction (X) of the base film 110, for example, the first direction X may be improved by the first and second heat dissipation members 140a and 140b.

As mentioned above, the chip on film package 100 may include a pair of the first heat dissipation members 140a and 140b arranged on the first surface 112 of the base film 110 to be spaced apart from both sides of the semiconductor chip 120 and extend in the first direction (X direction) substantially perpendicular to the extending direction of the base film 110, and the second heat dissipation member 150 arranged on the base film 110 to cover the semiconductor chip 120 and the first heat dissipation members 140a and 140b. Additionally, the chip on film package 100 may further include the heat dissipation plate 160 extending in the first direction X on the second surface 114 to overlap the semiconductor chip 120.

Accordingly, the first and second heat dissipation members 140a, 140b, and 150 extending in the first direction X may increase the heat dissipation property in the first direction X of the base film 110 to thereby effectively spread heat from the semiconductor chip 120. Further, the heat dissipation plate 160 may increase a heat dissipating area to thereby increase the heat dissipation property. Thus, heat dissipation performance of the chip on film package 100 may be increased.

Hereinafter, a method of manufacturing the chip on film package in FIG. 3 will be explained.

Figure 10:
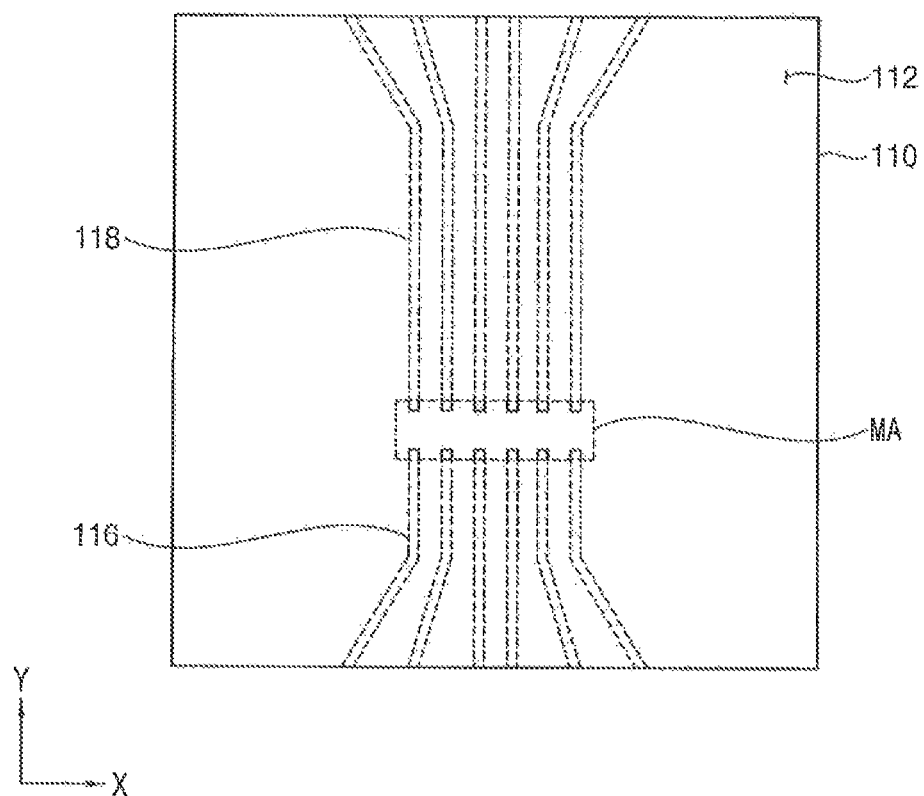
FIGS. 10, 11, 12, 13, 14, 15 and 16 are views illustrating a method of manufacturing a chip on film package in accordance with an exemplary embodiment of the present inventive concept.
Figure 11:
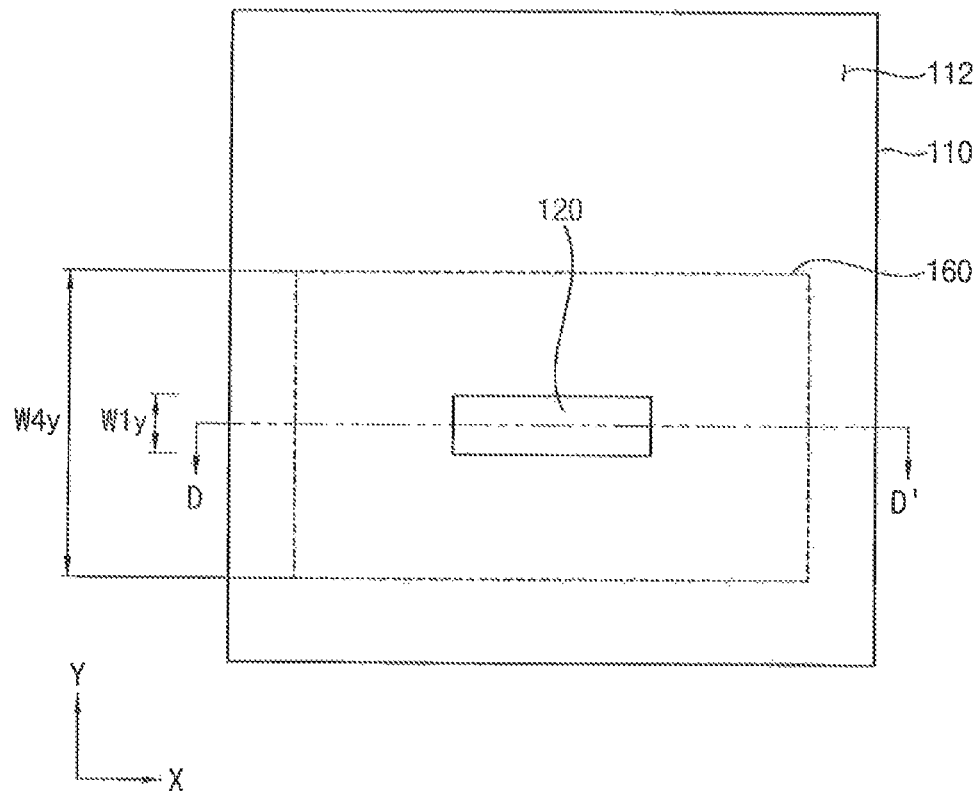
Figure 12:
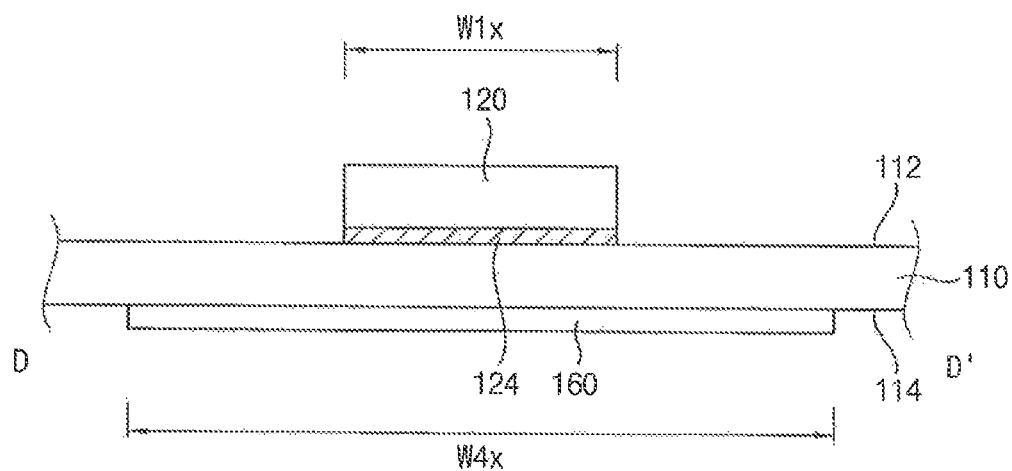
Figure 13:
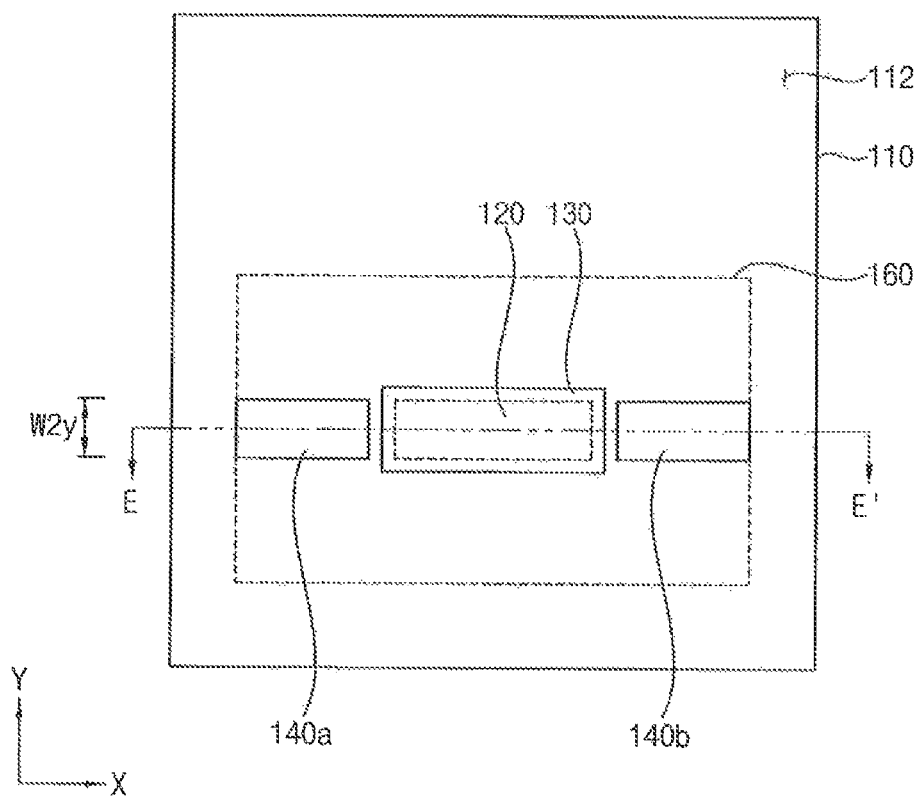
Figure 14:
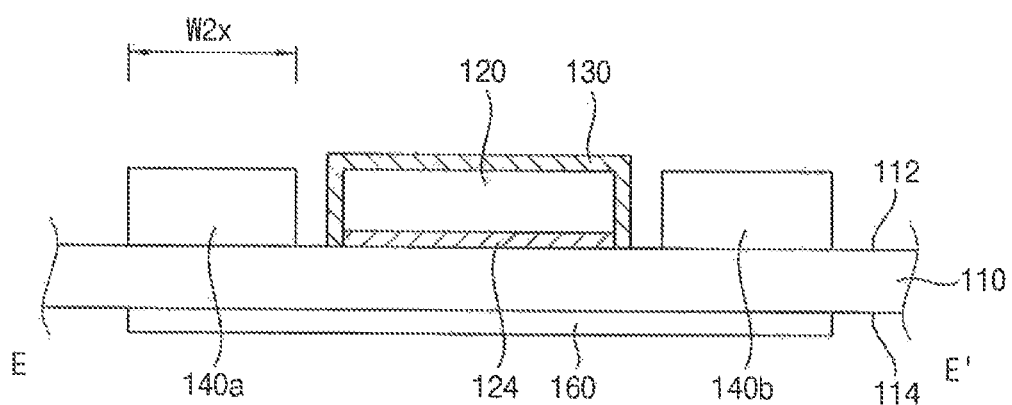
Figure 15:
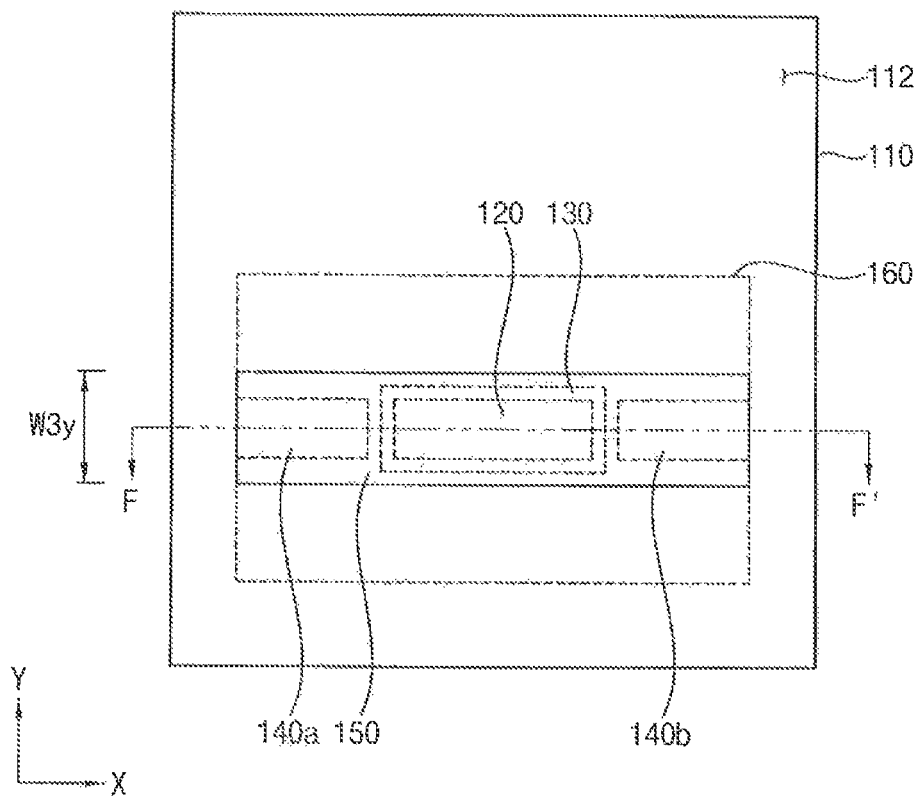
Figure 16:
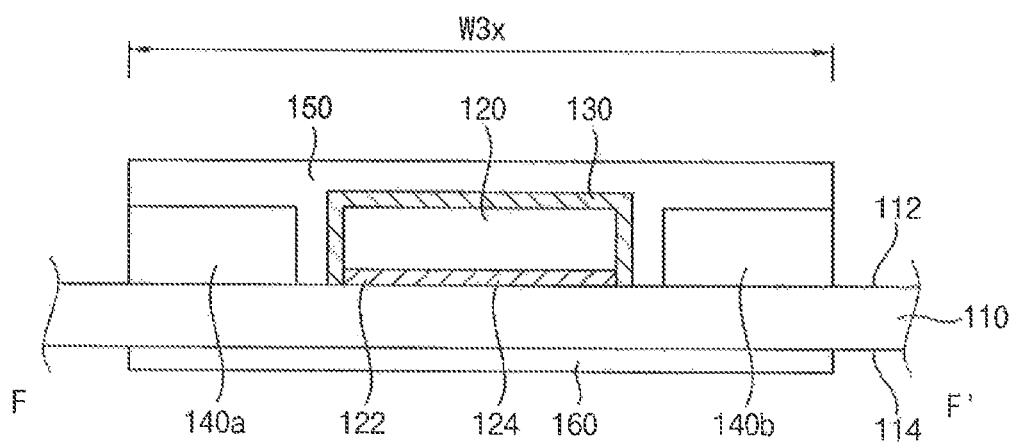

FIGS. 10 to 16 are views illustrating a method of manufacturing a chip on film package in accordance with an exemplary embodiment of the present inventive concept. FIGS. 10, 11, 13 and 15 are plan views illustrating a first surface of a base film, FIG. 12 is a cross-sectional view taken along the line D-D' in FIG. 11, FIG. 14 is a cross-sectional view taken along the line E-E' in FIG. 13, and FIG. 16 is a cross-sectional view taken along the line F-F' in FIG. 15.

Referring to FIGS. 10 to 12, a semiconductor chip 120 may be mounted on a chip mounting region MA of a base film 110.

In an exemplary embodiment of the present inventive concept, the base film 110 may be a flexible insulation film having a first surface 112 and a second surface 114 opposite to each other. For example, the base film 110 may include polyimide, polyester, polycarbonate, poly-epoxy, etc.

The base film 110 may include the chip mounting region MA, a first terminal region TA1 at a first side of the chip mounting region MA and a second terminal region TA2 at a second side of the chip mounting region MA. The chip mounting region MA may be positioned in a middle region of the base film 110, and may be a region on which the semiconductor chip 120 is mounted.

A wiring pattern may be formed on the first surface 112 of the base film 110. For example, after a metal thin film is adhered to a surface, of the base film 110 by an electrodeposition or thermocompression process, a photolithography process and an etch process may be performed on the metal thin film to form the wiring pattern. The metal thin film may be made of, for example, copper (Cu), gold (Au), tin (Sn), lead (Pb) silver (Ag), nickel (Ni), etc. Additionally, other conductive material may be formed on the wiring pattern by an electroplating process.

The wiring pattern may include a plurality of input wirings 116 and a plurality of output wirings 118. The input wirings 116 and the output wirings 118 may extend from the inside of the chip mounting region MA to the outside thereof. The input wirings 116 may extend in an extending direction Y of the base film 110, for example, a second direction Y in the first terminal region TA1. The output wirings 118 may extend in the second direction Y of the base film 110 in the second terminal region TA2. Each of the input wirings 116 and the output wirings 118 may be arranged along a first direction X substantially perpendicular to the extending direction (Y) of the base film 110 to be spaced apart from each other.

In an exemplary embodiment of the present inventive concept, the semiconductor chip 120 may be mounted on the base film 110 in a flip chip bonding manner. The semiconductor chip 120 may be electrically connected to the input wirings 116 and the output wirings 118 on the first surface 112 of the base film 110 via conductive bumps 122. The bumps 122 may be disposed on connection pads of the input wirings 116 and the output wiring 118 respectively such that the semiconductor chip 120 may be bonded on the base film 110.

The semiconductor chip 120 may be bonded to the base film 110, and then, an adhesive underfill layer 124 may be underfilled between the semiconductor chip 120 and the base film 110. The underfill layer 124 may include an epoxy material to reinforce a gap between the semiconductor chip 120 and the base film 110.

For example, the semiconductor chip 120 may be a display panel driving chip. The semiconductor chip 120 may have a width W1$x$ in the first direction X and a width W1$y$ in the second direction Y. The width W1$x$ in the first direction X may be greater than a width W1$y$ in the second direction Y. For example, the width W1$x$ in the first direction X of the semiconductor chip 120 may range from about 10 mm to about 30 mm. The width W1$y$ in the second direction Y of the semiconductor chip 120 may range from about 0.3 mm to about 1 mm. A height of the semiconductor chip 120 may range from about 400 μm to about 650 μm from the base film 110.

In an exemplary embodiment of the present inventive concept, a heat dissipation plate 160 may be formed on the second surface 114 of the base film 110. The heat dissipation plate 160 may be disposed to overlap with the chip mounting region MA. The heat dissipation plate 160 may extend in the first direction X.

The heat dissipation plate 160 may include, for example, a metal tape. The heat dissipation plate 160 may be a heat transfer member including a material with relatively high thermal conductivity. For example, the heat dissipation plate 160 may be a metal plate including aluminum, copper, silver, gold or an alloy thereof.

The heat dissipation plate 160 may have a width W4$x$ in the first direction X and a width W4$y$ in the second direction Y. The width W4$x$ in the first direction X may be greater than the width W4$y$ in the second direction Y. For example, the width W4$x$ in the first direction X of the heat dissipation plate 160 may range from about 20 mm to about 30 mm. The width W4y in the second direction Y of the heat dissipation plate 160 may range from about 8 mm to about 16 mm.

Referring to FIGS. 13 and 14, a heat dissipating insulation layer 130 may be coated on the semiconductor chip 120, and a pair of first heat dissipation members 140a and 140b may be disposed in both sides of the semiconductor chip 120 on the first surface 112 of the base film 110.

In an exemplary embodiment of the present inventive concept, the heat dissipating insulating layer 130 may be coated conformally on the exposed surfaces of the semiconductor chip 120 on the first surface 112 of the base film 110 by a spray coating process such that the surfaces of the semiconductor chip 120 may be entirely covered. An insulation material may be sprayed out on exposed side surfaces of the adhesive underfill layer 124 and exposed side surfaces and an upper surface of the semiconductor chip 120 using a spray nozzle to form the heat dissipating insulation layer 130 having a substantially uniform thickness.

The insulation material may have thermal conductivity. For example, the heat dissipating insulation layer 130 may include silica (SiO2), aluminum oxide ($Al_2O_3$), boron nitride (BN), aluminum nitride (AlN), ceramics coated metal balls, etc.

Then, a pair of the first heat dissipation members 140a and 140b may be arranged at both sides of the semiconductor chip 120 on the first surface 112 of the base film 110. The first heat dissipation members 140a and 140b may extend in a direction perpendicular to the extending direction (Y) of the base film 110, for example, the first direction (X direction).

The first heat dissipation members 140a and 140b may be formed to be spaced apart from respective sides of the semiconductor chip 120. The first heat dissipation members 140a and 140b may be spaced apart from the heat dissipating insulation layer 130 on the semiconductor chip 120. Thus, failures in following process stages due to the first heat dissipation members 140a and 140b may be prevented or reduced.

For example, the first heat dissipation members 140a and 140b may be adhered on the base film 110 using an adhesive film having thermal conductivity. For example, the first heat dissipation members 140a and 140b may include a silicon dummy member. The adhesive film may include a film such as DAF (a die attach film).

Each of the first heat dissipation members 140a and 140b may have a width W2x in the first direction X and a width W2y in the second direction Y. The width W2x in the first direction X may be greater than the width W2y in the second direction Y. For example, the width W2x in the first direction X of each of the first heat dissipation members 140a and 140b may range from about 4 mm to about 8 mm. The width W2y in the second direction Y of each of the first heat dissipation members 140a and 140b may range from about 0.5 mm to about 1 mm. A height of each of the first heat dissipation members 140a and 140b may range from about 500 μm to about 700 μm from the base film 110. A spacing between the semiconductor chip 120 and the first heat dissipation members 140a and 140b may range from about 0.5 mm to about 1.5 mm. A thickness of the first heat dissipation members 140a and 140b may be greater than a thickness of the base film 110.

Referring to FIGS. 15 and 16, a second heat dissipation member 150 may be disposed on the first surface 112 of the base film 110 to cover the semiconductor chip 120 and the first heat dissipation members 140a and 140b.

In an exemplary embodiment of the present inventive concept, the second heat dissipation member 150 may be formed by a dispensing process, a screen printing process, etc. For example, a metal paste may be dispensed along the first direction X on the semiconductor chip 120 and the first heat dissipation members 140a and 140b.

The metal paste may include a conductive material having thermal conductivity such as a metal such as gold (Au), silver (Ag), copper (Cu), etc.

The second heat dissipation member 150 may be provided to fill the space between the semiconductor chip 120 and the first heat dissipation members 140a and 140b. The second heat dissipation member 150 may extend in a vertical direction to be in contact with the first surface 112 of the base film 110, and may extend between the semiconductor chip 120 and the first heat dissipation members 140a and 140b. An outer surface of the first heat dissipation members 140a and 140b may be exposed by the second heat dissipation member 150.

The second heat dissipation member 150 may have a width W3x in the first direction X and a width W3y in the second direction Y. The width W3x in the first direction X may be greater than the width W3y in the second direction Y. For example, the width W3x in the first direction X of the second heat dissipation member 150 may range from about 20 mm to about 30 mm. The width $W3_y$ in the second direction Y of the second heat dissipation member 150 may range from about 2 mm to about 6 mm. A height of the second heat dissipation member 150 may range from about 600 μm to about 750 μm from the base film 110. The width W3x in the first direction X of the second heat dissipation member 150 may be the same as the width W4x in the first direction X of the heat dissipation plate 160.

A length (or, e.g., width) in the first direction X of the second heat dissipation member 150 may be the same as or greater than a sum of lengths (widths) in the first direction X of the semiconductor chip 120 and the first heat dissipation members 140a and 140b. The height of each of the first heat dissipation members 140a and 140b may be the same as or greater than the height of the semiconductor chip 120. The width W2y in the second direction Y of each of the first heat dissipation members 140a and 140b may be the same as or greater than the width W1y in the second direction Y of the semiconductor chip 120.

The first heat dissipation members 140a 140b may have a first thermal conductivity, and the second heat dissipation member 150 have a second thermal conductive less than the first thermal conductivity. For example, the first thermal conductivity of the first heat dissipation members 140a and 140b may range from about 100 W/mK to about 140 W/mk, and the second thermal conductivity of the second heat dissipation member 150 may range from about 40 W/mK to about 80 W/mk.

Then, the completed chip on film package may be used to electrically connect a display panel 20 (see FIG. 1) and a driving circuit portion 30 (see FIG. 1), to manufacture a display device 10.

While the present inventive concept has been particularly shown and described with reference to exemplary embodiments thereof, it will be apparent to those of ordinary skill in the art that various changes in form and detail may be made thereto without departing from the spirit and scope of the present inventive concept.

What is claimed is:
1. A chip on film package, comprising:
a flexible base film having a first surface and a second surface opposite to each other, and having a chip mounting region on the first surface;

a plurality of wirings extending in a first direction toward the chip mounting region;
a semiconductor chip mounted in the chip mounting region on the first surface of the base film and electrically connected to the wirings;
a pair of first heat dissipation members on the first surface of the base film and spaced apart from the semiconductor chip, and extending in a second direction perpendicular to the first direction; and
a second heat dissipation member on the first surface of the base film and covering the semiconductor chip and the pair of first heat dissipation members,
wherein each first heat dissipation member of the pair of first heat dissipation members covers a side surface of the semiconductor chip; and
wherein the second heat dissipation member contacts the first surface of the flexible base film to completely fill a space between the semiconductor chip and the pair of first heat dissipation members.

2. The chip on film package of claim 1, further comprising:
a heat dissipating insulation layer on the semiconductor chip.

3. The chip on film package of claim 1, wherein a length of the second heat dissipation member in the first direction is greater than a sum of lengths of the semiconductor chip and the pair of first heat dissipation members in the first direction.

4. The chip on film package of claim 1, wherein a thickness of each first heat dissipation member of the pair of first heat dissipation members is greater than a thickness of the base film.

5. The chip on film package of claim 1, wherein the pair of first heat dissipation members has a first thermal conductivity and the second heat dissipation member has a second thermal conductivity lower than the first thermal conductivity.

6. The chip on film package of claim 1, wherein the pair of first heat dissipation members comprises a silicon material, and wherein the second heat dissipation member comprises a metal paste.

7. The chip on film package of claim 1, further comprising:
a heat dissipation plate on the second surface of the base film, and extending in the first direction to overlap the chip mounting region.

8. The chip on film package of claim 7, wherein a width of the heat dissipation plate in the first direction is substantially the same as a width of the second beat dissipation member in the first direction.

9. A chip on a film package, comprising:
a flexible base film having a first surface and a chip mounting region on the first surface;
a semiconductor chip mounted in the chip mounting region;
a heat dissipating insulation layer on the semiconductor chip, wherein the heat dissipating insulation layer covers at least one side surface of the semiconductor chip;
a pair of first heat dissipation members on the first surface of the base film and spaced apart from the semiconductor chip; and
a second heat dissipation member on the first surface of the base film and covering the semiconductor chip and the pair of first heat dissipation members; and
wherein the second heat dissipation member contacts the first surface of the flexible base film to completely fill a space between the semiconductor chip and the pair of first heat dissipation members.

10. The chip on film package of claim 9, wherein the pair of first heat dissipation members has a first thermal conductivity, and wherein the second heat dissipation member has a second thermal conductivity lower than the first thermal conductivity.

11. The chip on film package of claim 9, further comprising:
a heat dissipation plate on a second surface, opposite the first surface, of the base film, and extending in a first direction to overlap the chip mounting region.

12. A display device, comprising:
a display panel; and
a chip on film package extending from the display panel and flexed to cover a lower surface of the display panel, wherein the chip on film package comprises:
a flexible base film connected to the display panel, and having a first surface and a chip mounting region on the first surface:
a semiconductor chip mounted in the chip mounting region;
a heat dissipating insulation layer on the semiconductor chip;
a pair of first heat dissipation members on the first surface of the base film and spaced apart from the semiconductor chip, wherein the semiconductor chip is disposed between the pair of first heat dissipation members; and
a second heat dissipation member on the first surface of the base film to cover the semiconductor chip and the pair of first heat dissipation members,
wherein each first heat dissipation member of the pair of first heat dissipation members covers a side surface of the semiconductor chip; and
wherein the second heat dissipation member contacts the first surface of the flexible base film to completely fill a space between the semiconductor chip and the pair of first heat dissipation members.

13. The display, device of claim 12, wherein the display panel is connected to the first surface of the base film.

14. The display device of claim 12, further comprising:
a printed circuit board overlapping the lower surface of the display panel, and connected to the chip on film package.

15. The display device of claim 14, wherein the base film comprises:
an input terminal pad connected to the printed circuit board to receive a driving signal; and
an output terminal pad connected to the display panel to output the driving signal.

16. The display device of claim 12, further comprising:
a heat dissipation plate on a second surface of the base film opposite to the first surface, and extending in a first direction to overlap the chip mounting region.

* * * * *